US011979001B2

(12) United States Patent
Nakajima et al.

(10) Patent No.: US 11,979,001 B2
(45) Date of Patent: May 7, 2024

(54) SURFACE-EMITTING SEMICONDUCTOR LASER

(71) Applicant: Sony Corporation, Tokyo (JP)

(72) Inventors: Hiroshi Nakajima, Tokyo (JP); Rintaro Koda, Tokyo (JP); Tatsushi Hamaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 653 days.

(21) Appl. No.: 17/264,558

(22) PCT Filed: May 28, 2019

(86) PCT No.: PCT/JP2019/021025
§ 371 (c)(1),
(2) Date: Jan. 29, 2021

(87) PCT Pub. No.: WO2020/026573
PCT Pub. Date: Feb. 6, 2020

(65) Prior Publication Data
US 2021/0249844 A1    Aug. 12, 2021

(30) Foreign Application Priority Data

Jul. 31, 2018  (JP) ................................. 2018-143044

(51) Int. Cl.
*H01S 5/183*     (2006.01)
*H01S 5/042*     (2006.01)
*H01S 5/343*     (2006.01)

(52) U.S. Cl.
CPC ........ *H01S 5/18338* (2013.01); *H01S 5/0425* (2013.01); *H01S 5/18361* (2013.01);
(Continued)

(58) Field of Classification Search
CPC . H01S 5/18308–18338; H01S 5/18341; H01S 5/04252–04253; H01S 5/18338
See application file for complete search history.

(56) References Cited

U.S. PATENT DOCUMENTS

| 5,537,666 A * | 7/1996 | Mori ................... H01S 5/18369 |
| | | 372/92 |
| 6,611,003 B1 * | 8/2003 | Hatakoshi ............... H01L 33/20 |
| | | 257/E33.068 |

(Continued)

FOREIGN PATENT DOCUMENTS

| CN | 104348084 A * | 2/2015 | ........... H01S 5/0215 |
| JP | 58114479 A * | 7/1983 | |

(Continued)

OTHER PUBLICATIONS

International Search Report dated Aug. 27, 2019 in connection with PCT/JP2019/021025.

*Primary Examiner* — Joshua King
(74) *Attorney, Agent, or Firm* — K&L Gates LLP

(57) ABSTRACT

A surface-emitting semiconductor laser including: an active layer including a nitride semiconductor; a first semiconductor layer of a first electrical conduction type and a second semiconductor layer of a second electrical conduction type that are opposed to each other with the active layer therebetween; and a current confinement layer that is opposed to the active layer with the second semiconductor layer therebetween and has an opening, in which a side surface of the current confinement layer is inclined at at least a portion of a peripheral edge of the opening.

15 Claims, 10 Drawing Sheets

(52) U.S. Cl.
CPC ...... *H01S 5/34333* (2013.01); *H01S 5/04253* (2019.08); *H01S 5/18341* (2013.01)

(56) References Cited

U.S. PATENT DOCUMENTS

| | | | |
|---|---|---|---|
| 10,290,996 B1 * | 5/2019 | Mathai | H01S 5/18308 |
| 2001/0011730 A1 * | 8/2001 | Saeki | H01L 33/105 |
| | | | 257/79 |
| 2001/0035531 A1 * | 11/2001 | Kano | H01S 5/32341 |
| | | | 257/190 |
| 2003/0063649 A1 * | 4/2003 | Ezaki | H01S 5/1833 |
| | | | 372/96 |
| 2005/0078726 A1 * | 4/2005 | Watanabe | B82Y 20/00 |
| | | | 372/46.01 |
| 2007/0121693 A1 * | 5/2007 | Nakatsuka | B82Y 20/00 |
| | | | 372/43.01 |
| 2007/0280320 A1 * | 12/2007 | Feezell | H01S 5/18341 |
| | | | 372/46.01 |
| 2010/0208764 A1 * | 8/2010 | Otoma | H01S 5/04254 |
| | | | 372/50.1 |
| 2010/0284432 A1 * | 11/2010 | Hoshino | H01S 5/187 |
| | | | 257/E21.09 |
| 2011/0128343 A1 * | 6/2011 | Sato | H01S 5/18394 |
| | | | 347/224 |
| 2011/0176572 A1 | 7/2011 | Moser et al. | |
| 2016/0064900 A1 * | 3/2016 | Takeda | H01S 5/18361 |
| | | | 372/45.01 |
| 2017/0125978 A1 * | 5/2017 | Tazawa | H01S 5/18394 |
| 2017/0149213 A1 * | 5/2017 | Tazawa | H01S 5/18308 |
| 2017/0302057 A1 * | 10/2017 | Tazawa | H01S 5/18308 |
| 2018/0366906 A1 * | 12/2018 | Hamaguchi | H01S 5/028 |
| 2019/0067906 A1 * | 2/2019 | Yuen | H01S 5/06233 |
| 2019/0181615 A1 * | 6/2019 | Choi | H01S 5/18397 |
| 2019/0199063 A1 * | 6/2019 | Barve | H01S 5/18311 |
| 2019/0267774 A1 | 8/2019 | Sato et al. | |

FOREIGN PATENT DOCUMENTS

| | | | | |
|---|---|---|---|---|
| JP | S58114479 A | | 7/1983 | |
| JP | 05167192 A | * | 7/1993 | |
| JP | H0697564 A | * | 4/1994 | |
| JP | 2000196189 A | * | 7/2000 | ............. H01S 5/183 |
| JP | 2003179314 A | | 6/2003 | |
| JP | 2003179314 A | * | 6/2003 | |
| JP | 2006080427 A | * | 3/2006 | ......... H01S 5/18308 |
| JP | 2011003661 A | * | 1/2011 | |
| JP | 2011003661 A | | 1/2011 | |
| KR | 100210288 B1 | * | 7/1999 | |
| WO | WO-2016125346 A1 | * | 8/2016 | ....... H01L 21/02389 |
| WO | WO-2017018017 A1 | * | 2/2017 | ............. H01S 5/028 |
| WO | 2018083877 A1 | | 5/2018 | |
| WO | WO-2018083877 A1 | * | 5/2018 | ........... H01S 5/0267 |
| WO | WO-2019003627 A1 | * | 1/2019 | ........... H01S 5/0207 |
| WO | WO-2019070719 A1 | * | 4/2019 | ........... H01S 5/0213 |
| WO | WO-2019216685 A1 | * | 11/2019 | ........... H01S 5/0425 |

* cited by examiner

[FIG. 1]
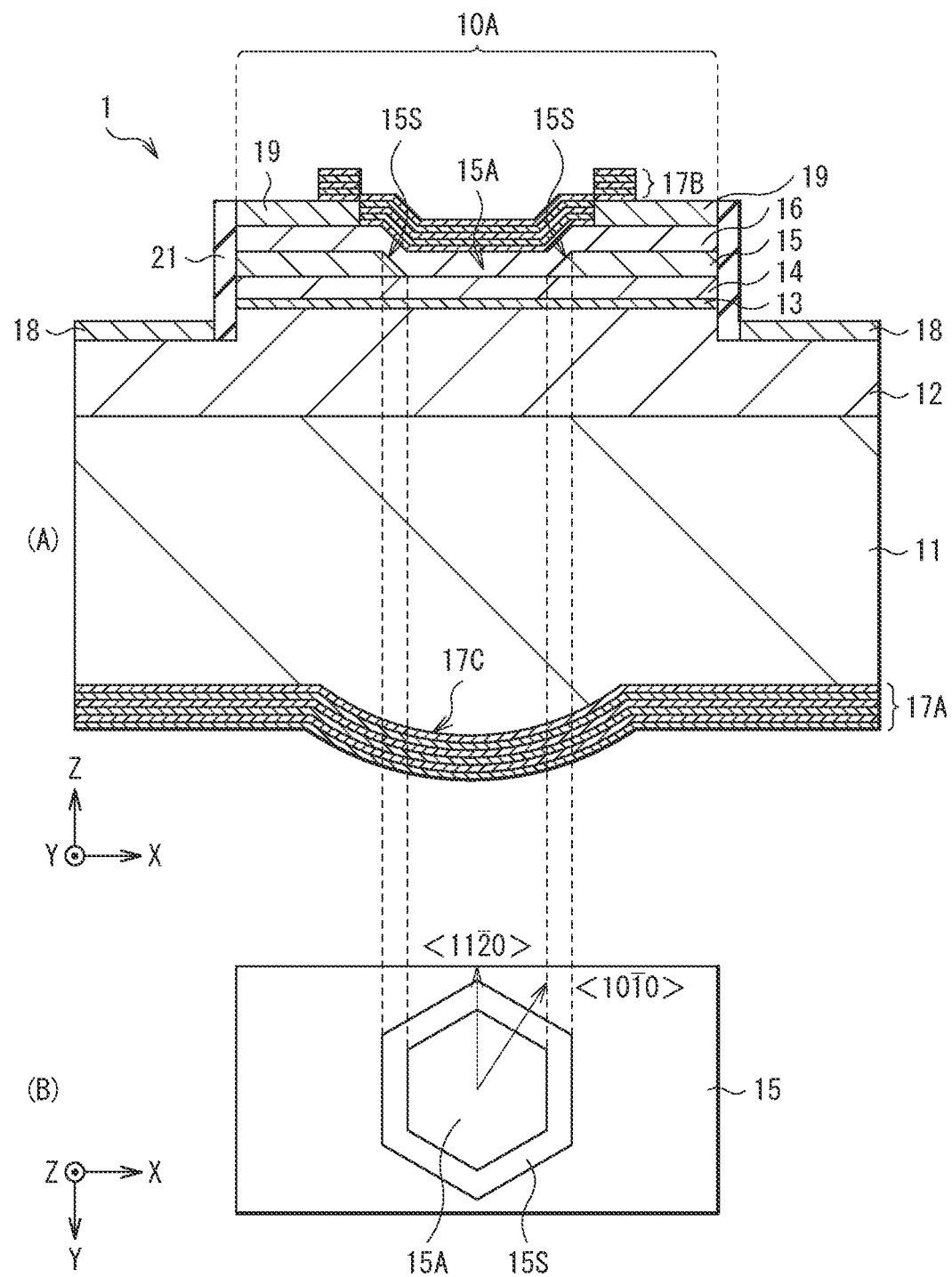

[ FIG. 2A ]
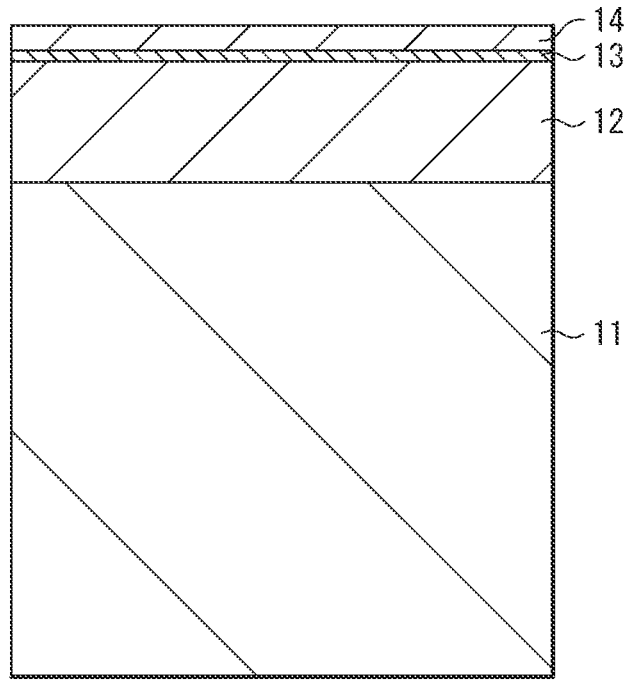
[ FIG. 2B ]
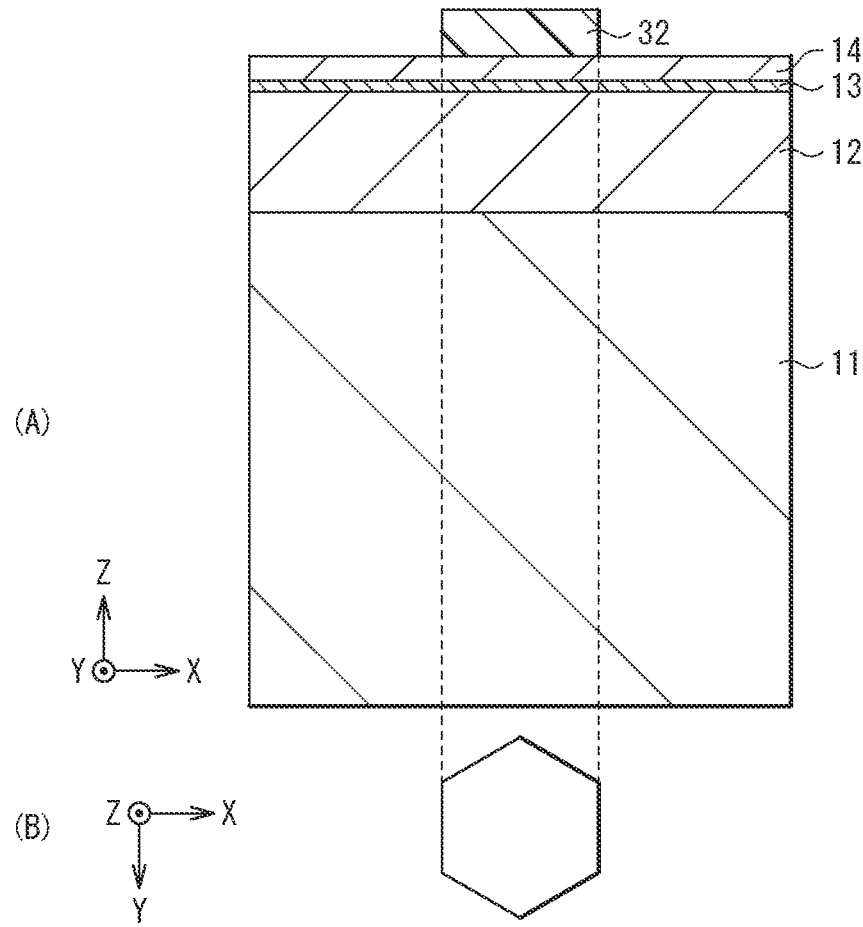

[FIG. 2C]
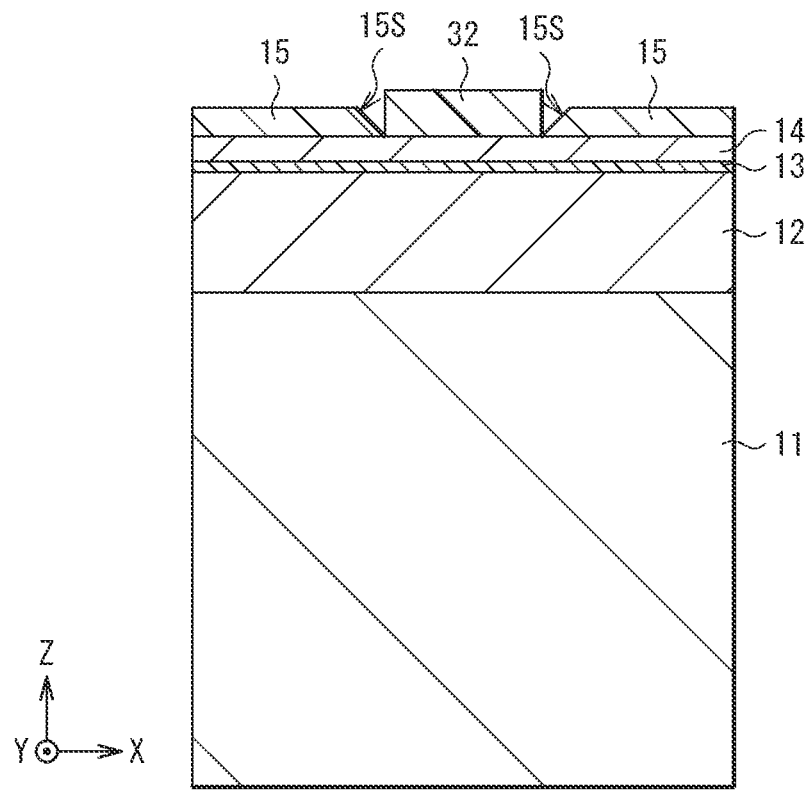
[FIG. 2D]
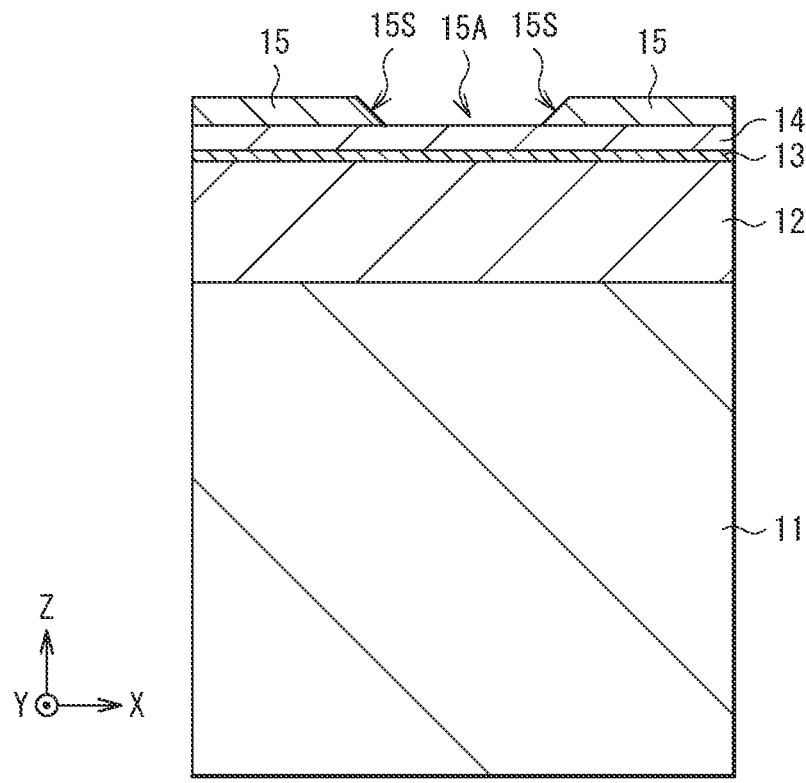

[ FIG. 3A ]
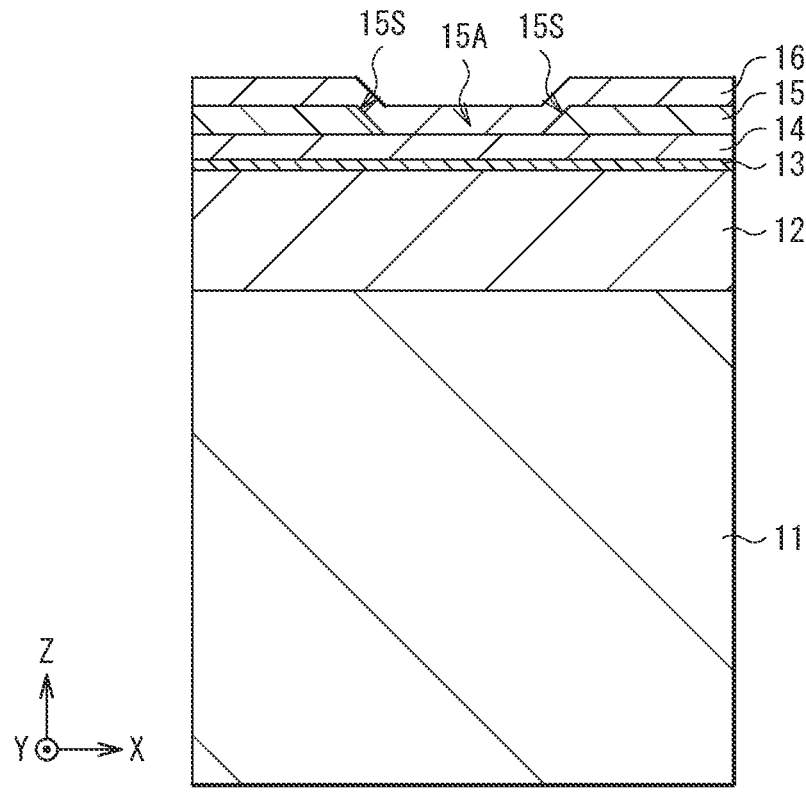
[ FIG. 3B ]
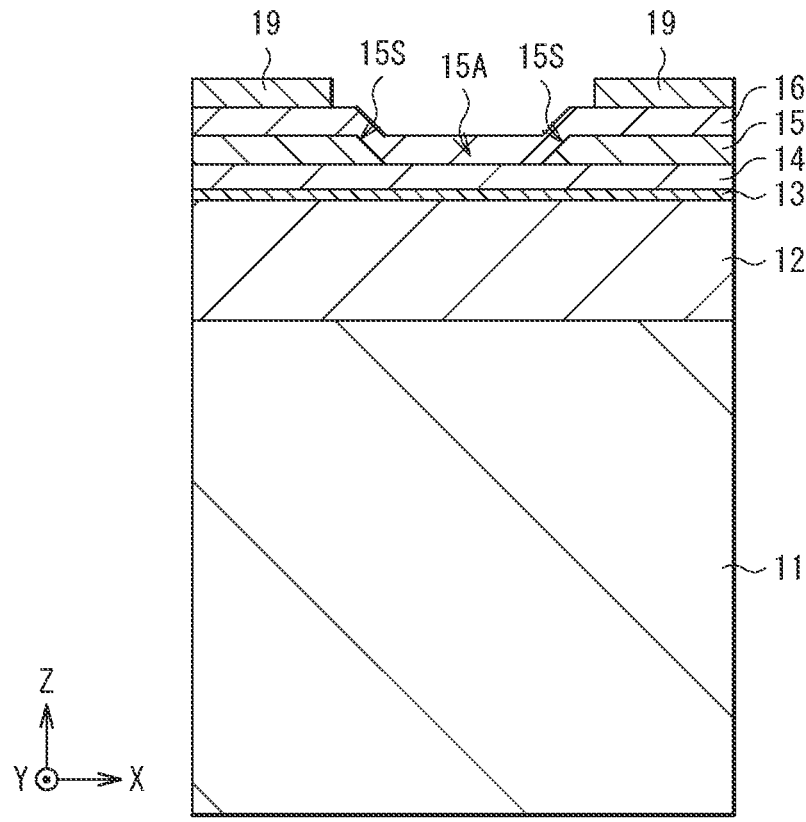

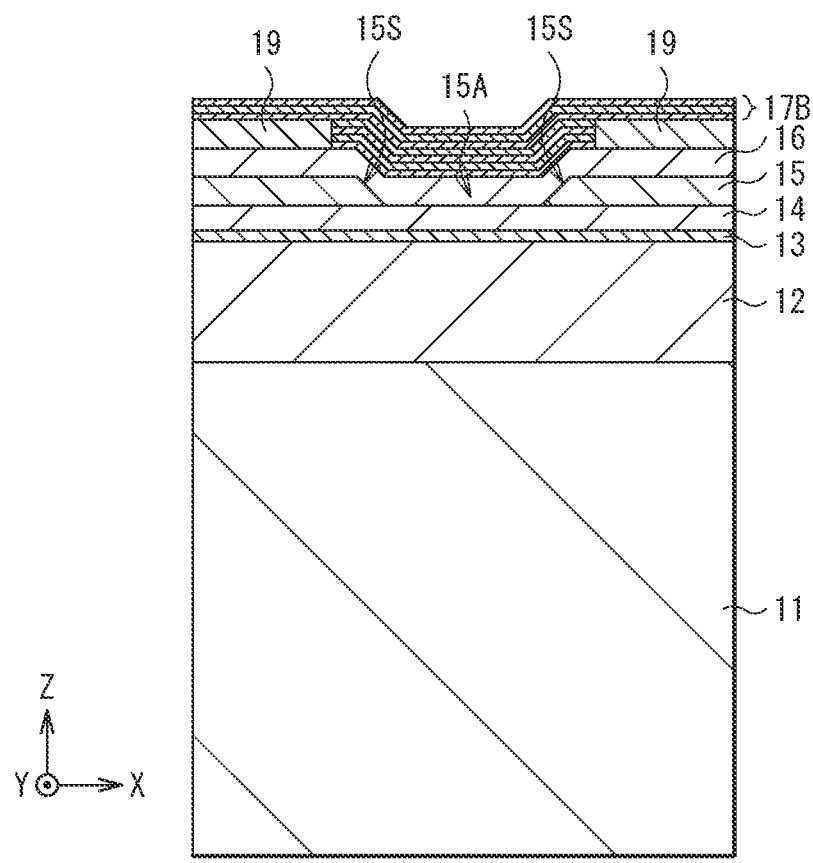

[FIG. 3D]
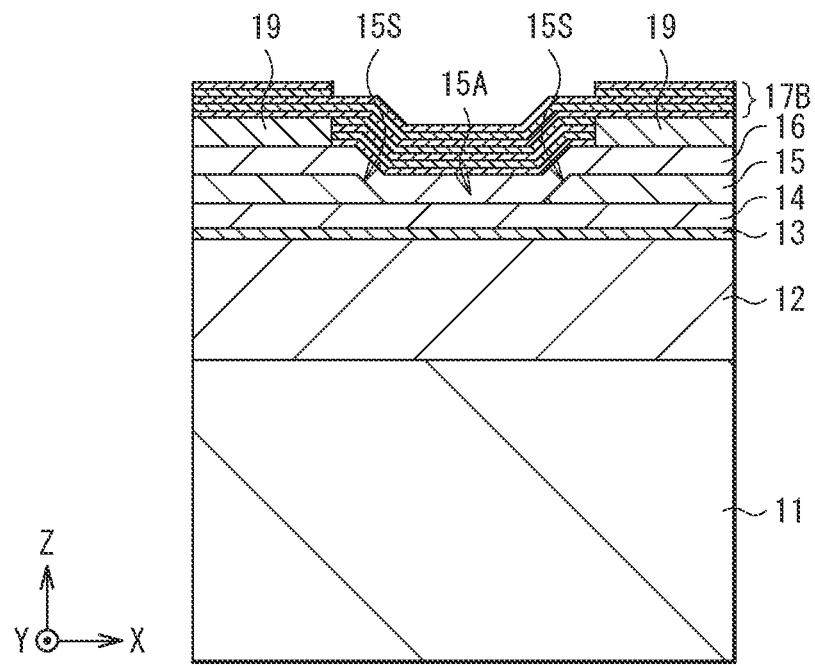
[FIG. 3E]
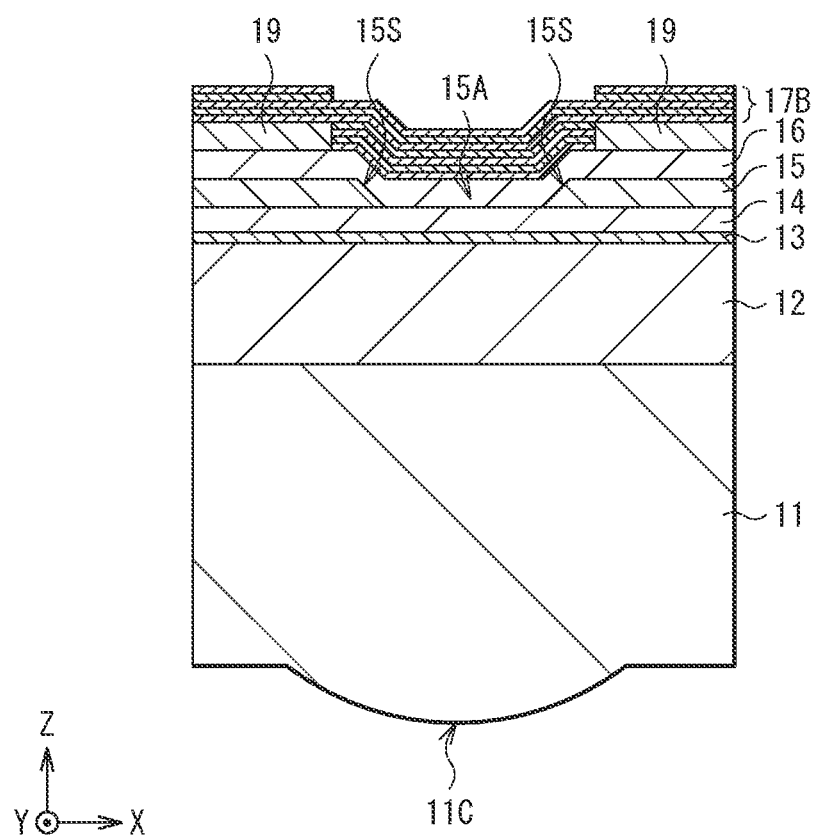

[ FIG. 4 ]
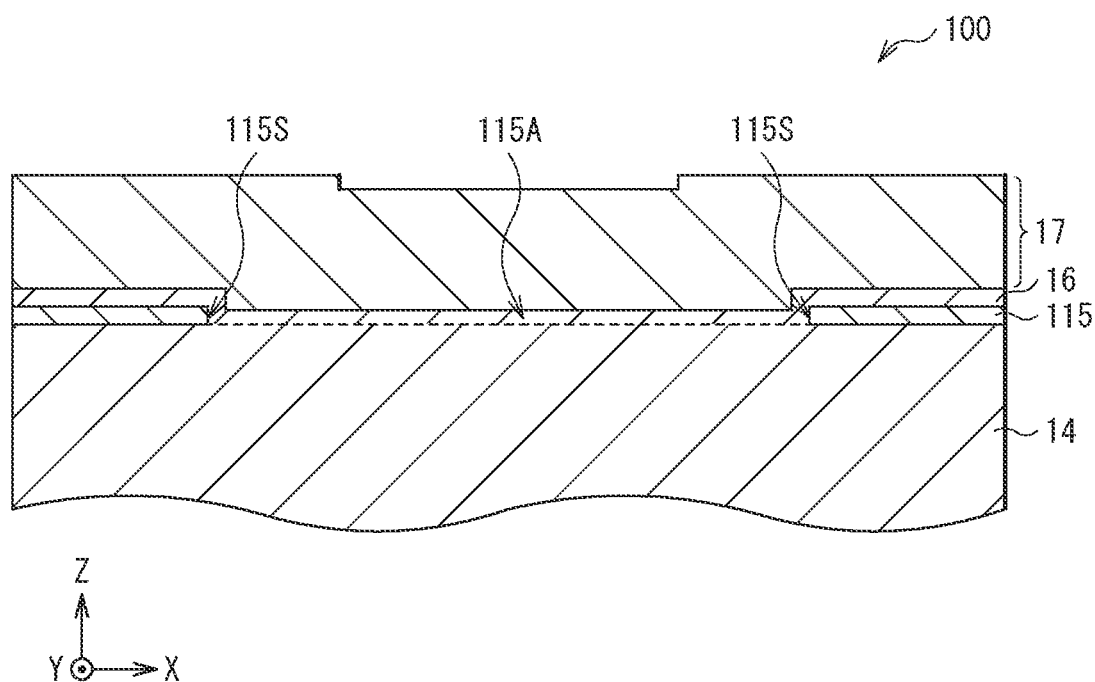

[FIG. 5]
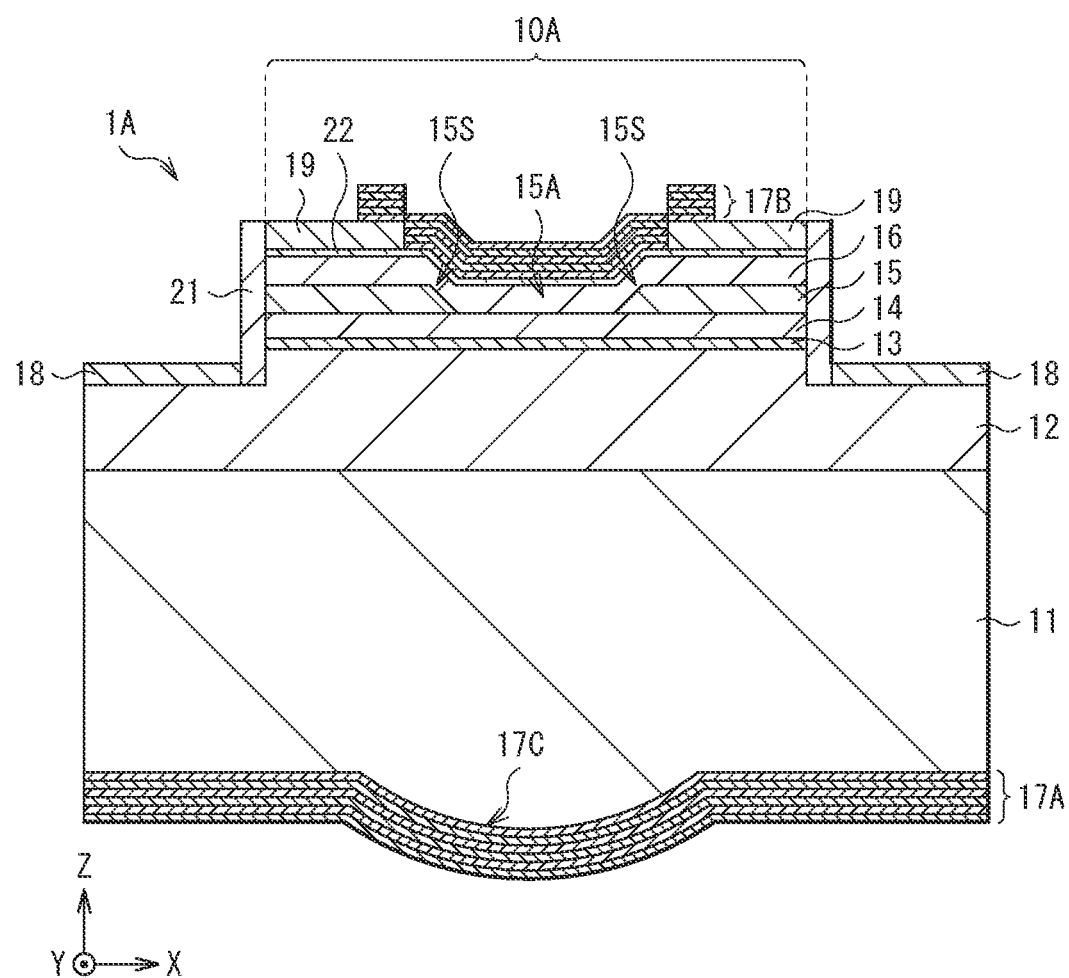

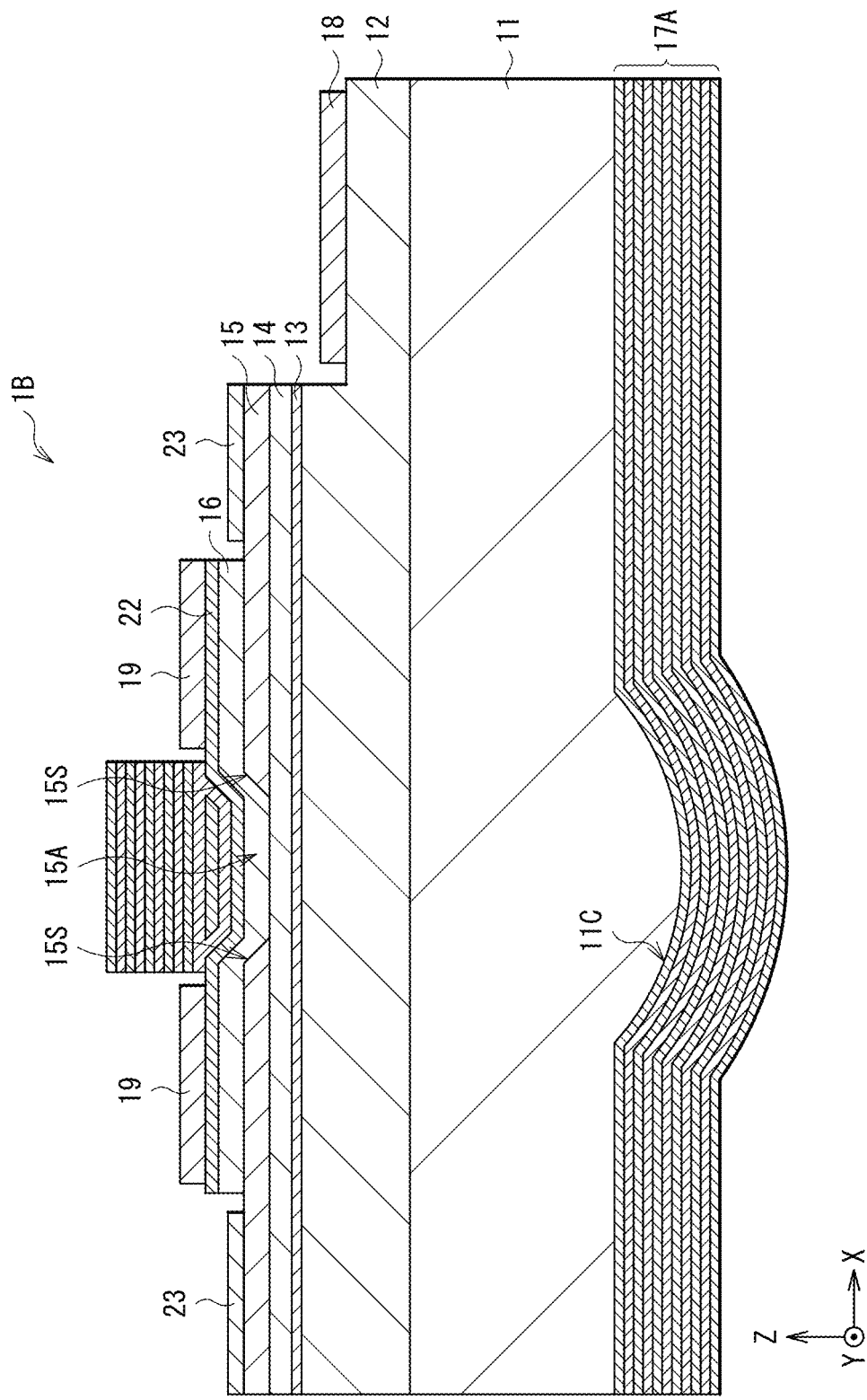
[FIG. 6]

[ FIG. 7 ]
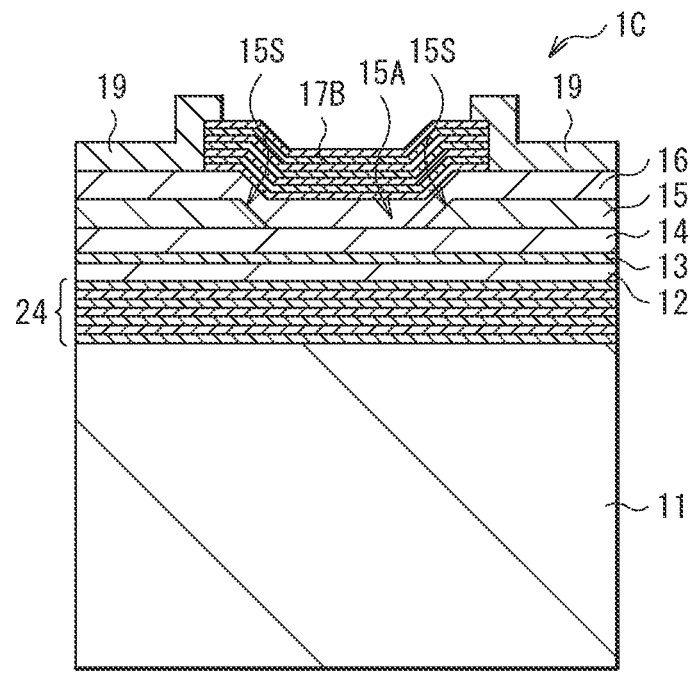
[ FIG. 8 ]
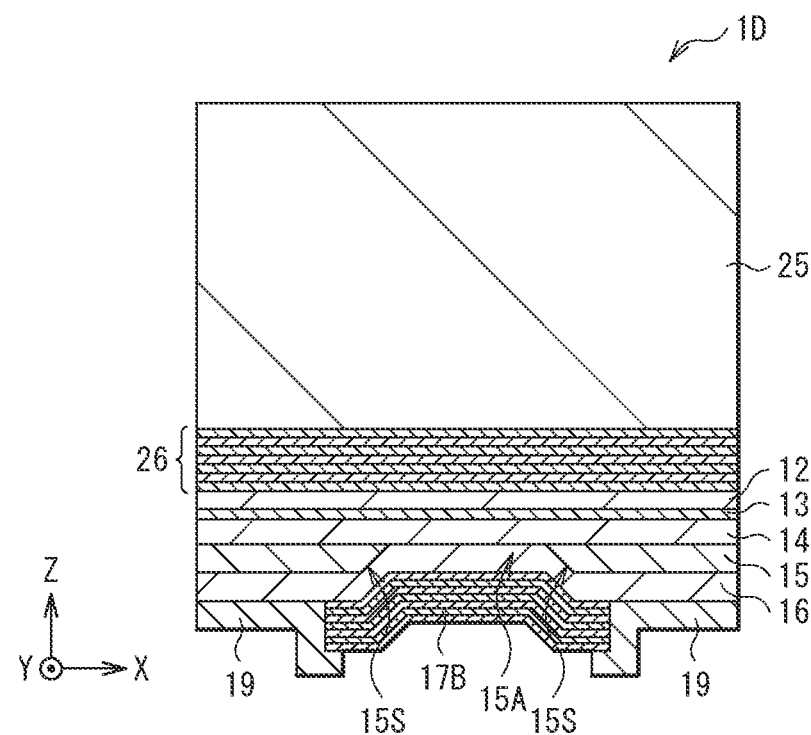

SURFACE-EMITTING SEMICONDUCTOR LASER

DESCRIPTION

Technical Field

The present technology relates to a surface-emitting semiconductor laser using a nitride semiconductor.

Background Art

Surface-emitting semiconductor lasers using a nitride semiconductor are expected to be applied to a light source or the like for displays and visible light communications. Examples of the surface-emitting semiconductor lasers include a VCSEL (Vertical Cavity Surface Emitting LASER) (for example, see PTL 1).

CITATION LIST

Patent Literature

PTL 1: Japanese Unexamined Patent Application Publication No. 2015-103783

SUMMARY OF THE INVENTION

Regarding the surface-emitting semiconductor lasers, it is desired that a rise in a threshold current value resulting from a current confinement structure be suppressed.

Therefore, it is desirable to provide a surface-emitting semiconductor laser that makes it possible to suppress a rise in the threshold current value resulting from the current confinement structure.

A surface-emitting semiconductor laser according to an embodiment of the present technology includes: an active layer including a nitride semiconductor; a first semiconductor layer of a first electrical conduction type and a second semiconductor layer of a second electrical conduction type that are opposed to each other with the active layer therebetween; and a current confinement layer that is opposed to the active layer with the second semiconductor layer therebetween and has an opening. A side surface of the current confinement layer is inclined at at least a portion of a peripheral edge of the opening.

In the surface-emitting semiconductor laser according to the embodiment of the present technology, because the side surface of the current confinement layer at the peripheral edge of the opening is inclined, it becomes easier to perform crystal growth on the opening of the current confinement layer. As a result, a discontinuity at a step is less likely to occur in a semiconductor layer (a third semiconductor layer) on the current confinement layer.

The surface-emitting semiconductor laser according to the embodiment of the present technology makes it possible to suppress the occurrence of a discontinuity at a step in the semiconductor layer (the third semiconductor layer) to be formed on the current confinement layer because the side surface of the current confinement layer at the peripheral edge of the opening is inclined. Consequently, it is possible to suppress a rise in the threshold current value resulting from the current confinement structure.

It is to be noted that the above-described contents are an example of the present disclosure. The effects of the present disclosure are not limited to those described above, and may be other different effects, or may further include other effects.

BRIEF DESCRIPTION OF THE DRAWINGS (A) of FIG. 1 is a schematic cross-sectional diagram illustrating an outline configuration of a semiconductor laser according to an embodiment of the present technology, and (B) of FIG. 1 is a schematic diagram illustrating an example of a planar configuration of a current confinement layer illustrated in (A).

FIG. 2A is a schematic cross-sectional diagram illustrating a step of a method of manufacturing the semiconductor laser illustrated in (A) of FIG. 1.

(A) of FIG. 2B is a schematic cross-sectional diagram illustrating a step subsequent to FIG. 2A, and (B) of FIG. 2B is a schematic diagram illustrating an example of a planar configuration of a mask illustrated in (A).

FIG. 2C is a schematic cross-sectional diagram illustrating a step subsequent to FIG. 2B.

FIG. 2D is a schematic cross-sectional diagram illustrating a step subsequent to FIG. 2C.

FIG. 3A is a schematic cross-sectional diagram illustrating a step subsequent to FIG. 2D.

FIG. 3B is a schematic cross-sectional diagram illustrating a step subsequent to FIG. 3A.

FIG. 3C is a schematic cross-sectional diagram illustrating a step subsequent to FIG. 3B.

FIG. 3D is a schematic cross-sectional diagram illustrating a step subsequent to FIG. 3C.

FIG. 3E is a schematic cross-sectional diagram illustrating a step subsequent to FIG. 3D.

FIG. 4 is a cross-sectional diagram illustrating a schematic configuration of a main part of a semiconductor laser according to a comparative example.

FIG. 5 is a schematic cross-sectional diagram illustrating an outline configuration of a semiconductor laser according to Modification Example 1.

FIG. 6 is a schematic cross-sectional diagram illustrating an outline configuration of a semiconductor laser according to Modification Example 2.

FIG. 7 is a schematic cross-sectional diagram illustrating an outline configuration of a semiconductor laser according to Modification Example 3.

FIG. 8 is a schematic cross-sectional diagram illustrating an outline configuration of a semiconductor laser according to Modification Example 4.

MODES FOR CARRYING OUT THE INVENTION

The following describes an embodiment of the present technology in detail with reference to the drawings. It is to be noted that description is given in the following order.

1. Embodiment
Semiconductor laser including a current confinement layer whose side surfaces at peripheral edges of an opening are inclined
2. Modification Example 1
Example with a transparent electrode between a third semiconductor layer and a second electrode
3. Modification Example 2
Example with a third electrode in contact with the current confinement layer 4. Modification Example 3

Example with a first light-reflecting layer between a substrate and a first semiconductor layer 5. Modification Example 4

Example with the first light-reflecting layer including a dielectric

Embodiment (A) of FIG. 1 illustrates a schematic cross-sectional configuration of a main part of a surface-emitting semiconductor laser (a semiconductor laser 1) according to an embodiment of the present technology. The semiconductor laser 1 is a VCSEL, and has a structure in which a first light-reflecting layer 17A, a substrate 11, a first semiconductor layer 12, an active layer 13, a second semiconductor layer 14, a current confinement layer 15, a third semiconductor layer 16, and a second light-reflecting layer 17B are stacked in this order. The semiconductor laser 1 is provided with a mesa region 10A formed by, for example, performing etching from the third semiconductor layer 16 to a partial depth in the first semiconductor layer 12. The mesa region 10A has, for example, a column shape such as a cylindrical column shape. An end face of the mesa region 10A is covered with a dielectric film 21. The semiconductor laser 1 includes a first electrode 18 coupled to the first semiconductor layer 12 outside the mesa region 10A, and a second electrode 19 coupled to the third semiconductor layer 16 in the mesa region 10A.

The first light-reflecting layer 17A is a DBR (Distributed Bragg Reflector) disposed on the first-semiconductor-layer-12 side. In the mesa region 10A, the first light-reflecting layer 17A is opposed to the active layer 13 with the first semiconductor layer 12 therebetween to cause light generated in the active layer 13 to resonate between the first light-reflecting layer 17A and the second light-reflecting layer 17B.

As a dielectric material configuring the first light-reflecting layer 17A, it is possible to use an oxide, a nitride, or a fluoride containing silicon (Si), magnesium (Mg), aluminum (Al), hafnium (Hf), niobium (Nb), zirconium (Zr), scandium (Sc), tantalum (Ta), gallium (Ga), zinc (Zn), yttrium (Y), boron (B), titanium (Ti), or the like. Specific examples include silicon oxide ($SiO_2$), titanium oxide ($TiO_2$), niobium oxide ($Nb_2O_5$), zirconium oxide ($ZrO_2$), tantalum oxide ($Ta_2O_5$), zinc oxide (ZnO), aluminum oxide ($Al_2O_3$), hafnium oxide ($HfO_2$), aluminum nitride (AlN), and the like. It is possible to configure the first light-reflecting layer 17A by selecting two or more dielectric materials having different refractive indices from among the above dielectric materials and alternately stacking them. The first light-reflecting layer 17A includes a multilayered dielectric film of, for example, 14 pairs of silicon oxide ($SiO_2$)/tantalum oxide ($Ta_2O_5$) or the like. It is sufficient that the dielectric materials, the thicknesses, the number of layers to be stacked, etc. are adjusted to obtain a desired reflectance. The first light-reflecting layer 17A may include a multilayered semiconductor film.

The first light-reflecting layer 17A has a curved surface 17C at a position opposed to a current injection region (an opening 15A of the current confinement layer 15 to be described later), for example. The curved surface 17C is, for example, curved toward a side opposite to the first semiconductor layer 12, and functions as a concave mirror for the light generated in the active layer 13. The curved surface 17C of the first light-reflecting layer 17A constitutes, for example, a portion of a circle or a parabola. By providing the first light-reflecting layer 17A having such a curved surface 17C, an increase in diffraction loss is suppressed (for example, International Publication No. WO2018/083877). Accordingly, it becomes possible to achieve light confinement in a transverse direction (an X direction and a Y direction in (A) of FIG. 1), which makes it possible to reduce the spot size of the light.

The substrate 11 is provided between the first light-reflecting layer 17A and the first semiconductor layer 12, for example. The substrate 11 includes, for example, a c-plane gallium nitride (GaN) substrate.

The first semiconductor layer 12, the active layer 13, the second semiconductor layer 14, and the third semiconductor layer 16 provided on the substrate 11 include, for example, a nitride-based semiconductor material such as an InGaAlN-based semiconductor material, and generate, for example, light having a wavelength in an ultraviolet region or a visible region. Specifically, the nitride-based semiconductor materials such as InGaAlN-based semiconductor materials include gallium nitride (GaN), gallium aluminum nitride (GaAlN), gallium indium nitride (InGaN), and indium gallium aluminum nitride (InGaAlN).

The first semiconductor layer 12 provided between the first light-reflecting layer 17A and the active layer 13 includes n-type GaN, for example. The first semiconductor layer 12 contains, for example, silicon (Si) as an n-type impurity, and has an impurity concentration of about $1\times10^{18}$ cm$^{-3}$. The first semiconductor layer 12 has a thickness (dimension in a Z direction in (A) of FIG. 1) of, for example, 2 μm.

In the active layer 13 between the first semiconductor layer 12 and the second semiconductor layer 14, light emission occurs by application of a predetermined voltage between the first electrode 18 and the second electrode 19. The active layer 13 includes, for example, undoped InGaN. The active layer 13 may have a multi-quantum well (MQW: multi quantum well) structure. The active layer 13 having the multi-quantum well structure has a stacked structure of well layers and barrier layers.

The second semiconductor layer 14 and the third semiconductor layer 16 are opposed to the first semiconductor layer 12 with the active layer 13 therebetween. The second semiconductor layer 14 is provided between the active layer 13 and the current confinement layer 15, and the third semiconductor layer 16 is provided between the current confinement layer 15 and the second light-reflecting layer 17B. Such second semiconductor layer 14 and third semiconductor layer 16 include p-type GaN, for example. The second semiconductor layer 14 and the third semiconductor layer 16 contain, for example, magnesium (Mg) as a p-type impurity, and have an impurity concentration of about $1\times10^{19}$ cm$^{-3}$. Of the third semiconductor layer 16, a portion on the second-light-reflecting-layer-17B side may be higher in concentration of the p-type impurity than the other portions, and may have an impurity concentration of about $1\times10^{20}$ cm$^{-3}$. The portion of the third semiconductor layer 16 thereby functions as a contact layer. The contact layer may be configured with a superlattice structure. For example, the contact layer may be configured with a superlattice structure of $Al_xIn_yGa_{(1-x-y)}N/Al_{x'}In_{y'}Ga_{(1-x'-y')}N$ (where x≠x', y≠y'). By using the superlattice structure, it becomes easier for a current to flow in the transverse direction. Therefore, the current is uniformly injected to a region having a high light intensity, that is, to a central portion of the opening 15A, thus making it possible to reduce the threshold current value.

The current confinement layer 15 provided between the second semiconductor layer 14 and the third semiconductor layer 16 includes, for example, n-type $Al_zGa_{(1-z)}N$. It is preferable that $0 \leq z \leq 0.3$ because it is more difficult for the current confinement layer 15 having a higher aluminum (Al) content to lattice-match with the second semiconductor layer 14 and the third semiconductor layer 16. The current confinement layer 15 contains, for example, silicon (Si) as an n-type impurity. The current confinement layer 15 has an impurity concentration of $1 \times 10^{15}$ $cm^{-3}$ or more, for example. The current confinement layer 15 may include AlGaInN lattice-matched with GaN. It is also possible for the current confinement layer 15 to include an intrinsic semiconductor. If the current confinement layer 15 is configured with $AlzGa_{(1-z)}N$ or AlInGaN, a difference in refractive index between the third semiconductor layer 16 including p-type GaN and the current confinement layer 15 allows for light confinement in the transverse direction.

The current confinement layer 15 has the opening 15A at a position overlapping the active layer 13 in plan view (an XY plane in (A) of FIG. 1), more specifically, at a position opposed to the curved surface 17C of the first light-reflecting layer 17A. In the opening 15A, for example, the second semiconductor layer 14 and the third semiconductor layer 16 are in contact with each other. By providing the current confinement layer 15 having such an opening 15A, current confinement is achieved for the current injected from the second electrode 19 into the active layer 13 (the opening 15A functions as a current injection region), and it is thus possible to increase the efficiency of current injection.

In the present embodiment, side surfaces 15S of the current confinement layer 15 at peripheral edges of the opening 15A are inclined with respect to a surface (the XY plane in (A) of FIG. 1) of the second semiconductor layer 14. Specifically, the side surfaces 15S are inclined to form an obtuse angle with respect to the surface of the second semiconductor layer 14 exposed at the opening 15A, and the opening 15A widens as approaching the third semiconductor layer 16 from the second semiconductor layer 14. The third semiconductor layer 16 is provided to conform to the side surfaces 15S of the current confinement layer 15. As will be described in detail later, in the present embodiment, the current confinement layer 15 having such side surfaces 15S makes the third semiconductor layer 16 on the current confinement layer 15 less likely to suffer a discontinuity at a step, thus making it possible to suppress a rise in the threshold current value resulting from the current confinement structure. Although it is preferable that the side surfaces 15S be inclined at all of the peripheral edges of the opening 15A, the side surfaces 15S may be inclined at only some of the peripheral edges of the opening 15A.

(B) of FIG. 1 schematically illustrates a shape of the current confinement layer 15 in plan view. The opening 15A of the current confinement layer 15 has, for example, a substantially hexagonal shape in plan view. At least one side of the substantially hexagonal opening 15A is provided substantially in parallel to <11-20>, for example. By providing at least one side of the substantially hexagonal opening 15A substantially in parallel to <11-20>, as will be described later, it becomes easier for the side surfaces 15S to be {1-101} planes, which makes it possible to incline the side surfaces 15S with stability. Here, being substantially in parallel to <11-20> includes some manufacturing error or the like to the extent that the inclined side surfaces 15S are formable. A maximum length of the opening 15A is, for example, 100 μm or less, preferably 10 μm or less. The maximum length of the opening 15A is the distance between two opposite vertices of the substantially hexagonal opening 15A.

The side surfaces 15S are, for example, the {1-101} planes. For example, all of six side surfaces 15S at the peripheral edges of the opening 15A having a substantially hexagonal shape in plan view are the {1-101} planes. The {1-101} planes are formed as stabilized planes, being inclined with respect to the surface of the second semiconductor layer 14 when the current confinement layer 15 is formed using, for example, an MOCVD (Metal Organic Chemical Vapor Deposition) method or the like, as will be described later. The side surfaces 15S are provided at an angle of, for example, about 118 degrees with respect to the surface of the second semiconductor layer 14 exposed at the opening 15A. For example, all the six side surfaces 15S at the peripheral edges of the opening 15A having a substantially hexagonal shape in plan view may be inclined at the same angle, or some of the side surfaces 15S may be inclined at angles different from each other. Alternatively, with respect to the surface of the second semiconductor layer 14 exposed at the opening 15A, five of the side surfaces 15S may be provided perpendicularly, and only one of the side surfaces 15S may be inclined.

The current confinement layer 15 has a thickness of, for example, 5 nm or more and not more than 1 μm. If the thickness of the current confinement layer 15 is smaller than 5 nm, there is a possibility that current confinement cannot be effectively performed due to a tunneling effect. If the thickness of the current confinement layer 15 is greater than 1 μm, a difference in level between the surface of the second semiconductor layer 14 and the surface of the current confinement layer 15 becomes large and a discontinuity at a step can occur in an upper layer (such as the third semiconductor layer 16) on the current confinement layer 15.

The second light-reflecting layer 17B is a DBR disposed on the third-semiconductor-layer-16 side, and is provided in a region including a region opposed to the opening 15A. The second light-reflecting layer 17B is opposed to the first light-reflecting layer 17A (the curved surface 17C) with the active layer 13 therebetween. As a dielectric material configuring the second light-reflecting layer 17B, it is possible to use an oxide, a nitride, or a fluoride containing silicon (Si), magnesium (Mg), aluminum (Al), hafnium (Hf), niobium (Nb), zirconium (Zr), scandium (Sc), tantalum (Ta), gallium (Ga), zinc (Zn), yttrium (Y), boron (B), titanium (Ti), or the like. Specific examples include silicon oxide ($SiO_2$), titanium oxide ($TiO_2$), niobium oxide ($Nb_2O_5$), zirconium oxide ($ZrO_2$), tantalum oxide ($Ta_2O_5$), zinc oxide (ZnO), aluminum oxide ($Al_2O_3$), hafnium oxide ($HfO_2$), aluminum nitride (AlN), and the like. It is possible to configure the second light-reflecting layer 17B by selecting two or more dielectric materials having different refractive indices from among the above dielectric materials and alternately stacking them. The second light-reflecting layer 17B includes a multilayered dielectric film of, for example, 11.5 pairs of silicon oxide ($SiO_2$)/tantalum oxide ($Ta_2O_5$) or the like. It is sufficient that the dielectric materials, the thicknesses, the number of layers to be stacked, etc. are adjusted to obtain a desired reflectance. The second light-reflecting layer 17B may include a multilayered semiconductor film.

The first electrode 18 is intended to apply a voltage to the active layer 13 via the first semiconductor layer 12. The first electrode 18 is provided outside the mesa region 10A and is in contact with the first semiconductor layer 12. The first electrode 18 includes a metal film of, for example, gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), indium (In), or the like. The first electrode 18 may include a single-layered metal film or a metal film having a stacked structure. The first electrode 18 may include an electrically-conductive material other than metal.

The second electrode 19 is provided in the mesa region 10A, and is disposed at, for example, a position not overlapping the opening 15A in plan view (the XY plane in (A) of FIG. 1). The second electrode 19 is intended to apply a voltage to the active layer 13 via the third semiconductor layer 16 and the second semiconductor layer 14, and is in contact with the third semiconductor layer 16. The second electrode 19 may include a metal film similar to the metal film of the first electrode 18 described above.

The dielectric film 21 covering the end face of the mesa region 10A covers an entire side surface of each of the second electrode 19, the third semiconductor layer 16, the current confinement layer 15, the second semiconductor layer 14, the active layer 13, and the first semiconductor layer 12. The dielectric film 21 is intended to prevent electrical short-circuit or the like between the second electrode 19 and the first electrode 18. The dielectric film 21 includes, for example, silicon oxide ($SiO_2$) or the like.

Such a semiconductor laser 1 may be manufactured as follows, for example (FIGS. 2A to 3E).

First, as illustrated in FIG. 2A, the first semiconductor layer 12, the active layer 13, and the second semiconductor layer 14 are stacked in this order on the substrate 11. The formation of this stack is performed by, for example, epitaxial crystal growth using a method such as an MOCVD method. A growth temperature is about 1000° C., for example.

Next, as illustrated in (A) of FIG. 2B, a mask 32 is formed in a selective region on the second semiconductor layer 14. (B) of FIG. 2B schematically illustrates an example of a planar configuration of the mask 32. The mask 32 is intended to form the opening 15A of the current confinement layer 15, and has a substantially hexagonal shape in plan view, for example. The mask 32 is formed by, for example, forming a film of silicon oxide ($SiO_2$) or the like having a thickness of about 1 μm on the second semiconductor layer 14, and thereafter shaping the film by lithography. At this time, at least one side of the mask 32 having a substantially hexagonal shape in plan view is disposed to be substantially parallel to <11-20>. The mask 32 has a side length of, for example, about 3 μm.

After the mask 32 is formed, as illustrated in FIG. 2C, the current confinement layer 15 is formed on the second semiconductor layer 14. The current confinement layer 15 is formed by, for example, growing n-type $Al_{0.1}Ga_{0.9}N$ to a thickness of about 0.1 μm by using an MOCVD method. The current confinement layer 15 contains, for example, about $1\times10^{18}$ $cm^{-3}$ of silicon (Si) as an n-type impurity. A growth temperature is about 900° C., for example. At this time, the {1-101} planes, which are stabilized planes, are formed at peripheral edges of the mask 32. The side surfaces 15S inclined with respect to the surface of the second semiconductor layer 14 are formed by the {1-101} planes.

After the current confinement layer 15 is formed, as illustrated in FIG. 2D, the mask 32 is removed. The removal of the mask 32 is performed by wet etching, for example.

Subsequently, as illustrated in FIG. 3A, the third semiconducting layer 16 is formed to cover the current confinement layer 15 and the opening 15A. The third semiconductor layer 16 is formed by, for example, growing p-type GaN by using an MOCVD method. The third semiconductor layer 16 contains, for example, about $1\times10^{19}$ $cm^{-3}$ of magnesium (Mg) as a p-type impurity. An about 10-nm portion on the upper side in the third semiconductor layer 16 may have a p-type impurity concentration of about $1\times10^{20}$ $cm^{-3}$. This makes it possible for the upper-side portion of the third semiconductor layer 16 to function as a contact layer. After the third semiconductor layer 16 is formed, the mesa region 10A and the first electrode 18 are formed (not illustrated).

Subsequently, as illustrated in FIGS. 3B and 3C, the second electrode 19 and the second light-reflecting layer 17B are formed in this order on the third semiconductor layer 16. Thereafter, a support substrate (not illustrated) is bonded thereto to be opposed to the substrate 11 with the second light-reflecting layer 17B therebetween. For example, a silicon (Si) substrate is usable as the support substrate. The bonding is performed using a wax, for example.

After the support substrate is bonded, as illustrated in FIG. 3D, the substrate 11 is thinned by mechanical polishing, a CMP (Chemical Mechanical Polishing) method, or the like. Thereafter, a back surface (a surface opposite to the surface on which the first semiconductor layer 12, etc. are formed) of the substrate 11 thus thinned is subjected to a mirror finish. A surface roughness Ra of the back surface of the substrate 11 is preferably 10 nm or less.

Subsequently, as illustrated in FIG. 3E, a convex portion 11C is formed on the back surface side of the substrate 11. The convex portion 11C is intended to form the curved surface 17C of the first light-reflecting layer 17A, and is formed at a position opposed to the opening 15A of the current confinement layer 15. The convex portion 11C is formed in the following manner, for example. First, a resist layer is formed on a selective region of the substrate 11, and thereafter the resist layer is subjected to a reflow. Next, the resist layer having undergone the reflow and the back surface of the substrate 11 are etched back by using, for example, an RIE (Reactive Ion Etching) method. The convex portion 11C is thereby formed on the back surface of the substrate 11.

After the convex portion 11C is formed, the first light-reflecting layer 17A is formed on the back surface of the substrate 11 to cover the convex portion 11C. Thereafter, the support substrate is removed. It is possible to manufacture the semiconductor laser 1 in this manner, for example.

Operation

In this semiconductor laser 1, upon application of a predetermined voltage between the first electrode 18 and the second electrode 19, a current confined by the current confinement layer 15 is injected into the active layer 13 through the opening 15A. As a result, electronic-hole recombination occurs to cause light to be emitted. The light is reflected between the first light-reflecting layer 17A and the second light-reflecting layer 17B, travels therebetween to cause laser oscillation at a predetermined wavelength, and is extracted as laser light from the second-light-reflecting-layer-17B side, for example.

Workings and Effects

According to the semiconductor laser 1 of the present embodiment, because the side surfaces 15S of the current confinement layer 15 at the peripheral edges of the opening 15A are inclined, a discontinuity at a step is less likely to occur in an upper layer on the current confinement layer 15, that is, the third semiconductor layer 16. This makes it possible to suppress a rise in the threshold current value resulting from the current confinement structure. The workings and effects will be described below with use of a comparative example.

FIG. 4 illustrates a schematic cross-sectional configuration of a main part of a semiconductor laser (a semiconductor laser 100) according to the comparative example. The semiconductor laser 100 includes a current confinement layer (a current confinement layer 115) between the second semiconductor layer 14 and the third semiconductor layer 16, and the current confinement layer 115 is provided with an opening (an opening 115A). Side surfaces (side surfaces 115S) of the current confinement layer 115 at the peripheral edges of the opening 115A are disposed perpendicular to the surface of the second semiconductor layer 14. In other words, in the semiconductor laser 100, the side surfaces 115S of the current confinement layer 115 at the peripheral edges of the opening 115A are not inclined.

In such a semiconductor laser 100, when the third semiconductor layer 16 is grown, a discontinuity at a step can occur in the third semiconductor layer 16 due to the steep side surfaces 115S. The discontinuity at a step in the third semiconductor layer 16 inhibits carrier injection and causes a rise in the threshold current value.

Further, if the second semiconductor layer 14 and the third semiconductor layer 16 are configured with p-type GaN and the current confinement layer 115 is configured with AlGaN, it is possible to achieve light confinement in the transverse direction. However, if the side surfaces 115S of the current confinement layer 115 at the peripheral edges of the opening 115A are provided perpendicular to the surface of the second semiconductor layer 14, the refractive index abruptly changes at the peripheral edges of the opening 115A. Such an abrupt change in the refractive index causes an optical scattering loss. Such an optical scattering loss results in a rise in the threshold current value.

In contrast, in the semiconductor laser 1 of the present embodiment, the side surfaces 15S of the current confinement layer 15 at the peripheral edges of the opening 15A are inclined with respect to the surface of the second semiconductor layer 14, and the opening 15A widens as approaching the third semiconductor layer 16 from the second semiconductor layer 14. In other words, the inclination of the side surfaces 15S is gentler as compared with the side surfaces 115S of the semiconductor laser 100, and accordingly, a discontinuity at a step is less likely to occur during the formation of the third semiconductor layer 16. Therefore, carrier injection becomes smooth and a rise in the threshold current value is suppressed.

Further, due to the inclined side surfaces 15S, the refractive index gradually changes between the current confinement layer 15 and the second and third semiconductor layers 14 and 16 at the peripheral edges of the opening 15A. Accordingly, as compared with the semiconductor laser 100, optical scattering loss is suppressed. In other words, a rise in the threshold current value is suppressed.

As described above, in the present embodiment, because the side surfaces 15S of the current confinement layer 15 at the peripheral edges of the opening 15A are inclined, it is possible to suppress the occurrence of a discontinuity at a step in a semiconductor layer (the third semiconductor layer 16) to be formed on the current confinement layer 15. Accordingly, it is possible to suppress a rise in the threshold current value resulting from the current confinement structure.

Further, in the semiconductor laser 1, it is possible to achieve light confinement in the transverse direction due to a difference between a refractive index of the second semiconductor layer 14 and the third semiconductor layer 16 and a refractive index of the current confinement layer 15. At this time, because the change in the refractive index at the peripheral edges of the opening 15A is gentler than in the semiconductor laser 100, optical scattering loss is less likely to occur. In this respect also, it is possible to suppress a rise in the threshold current value.

Furthermore, in the semiconductor laser 1, a rise in the threshold current value resulting from deterioration of the crystallinity of the active layer 13 is also suppressed. A reason for this will be described below.

As a current confinement structure, for example, a method of performing implantation of ions such as boron ions ($B^+$) or the like is also conceivable. According to this method, however, because the ions diffuse also into the current injection region, the crystallinity of the active layer deteriorates due to the ions, and a nonradiative recombination center tends to be generated in the active layer. As a result, the threshold current value rises.

In contrast, in the semiconductor laser 1, the current confinement layer 15 is formed by crystal growth. In other words, the current confinement layer 15 is formed without using ion implantation. This makes it possible to suppress a rise in the threshold current value resulting from deterioration of the crystallinity of the active layer 13.

Providing the first light-reflecting layer 17A having the curved surface 17C at a position opposed to the opening 15A makes it possible to reduce the spot size of light, as described above. In other words, it is possible to reduce the size of the opening 15A. If the opening 15A is made smaller, the influence of the nonradiative recombination center generated at the boundary of the opening 15A by ion implantation becomes greater. Therefore, the present technology works effectively when the first light-reflecting layer 17A has the curved surface 17C.

The following describes modification examples of the foregoing embodiment. In the following description, the same components as those of the foregoing embodiment are denoted by the same reference numerals, and description thereof is omitted as appropriate.

Modification Example 1

FIG. 5 schematically illustrates a cross-sectional configuration of a main part of a semiconductor laser (a semiconductor laser 1A) according to Modification Example 1 of the foregoing embodiment. The semiconductor laser 1A includes a transparent electrode 22 between the third semiconductor layer 16 and the second electrode 19. Except for this point, the semiconductor laser 2 has a configuration similar to that of the semiconductor laser 1, and workings and effects thereof are also similar.

The transparent electrode 22 is intended to reduce a contact resistance between the third semiconductor layer 16 and the second electrode 19 and also to inject a current uniformly into the opening 15A. The transparent electrode 22 is provided, for example, over the entire surface of the third semiconductor layer 16, and is provided between the third semiconductor layer 16 and the second electrode 19, and between the third semiconductor layer and the second light-reflecting layer 17B.

The transparent electrode 22 includes, for example, a light-transmissive electrically-conductive material (a transparent electrically-conductive material). The transparent electrically-conductive material configuring the transparent electrode 22 may be, for example, indium-tin oxide (ITO: Indium Tin Oxide), indium-zinc oxide (IZO: Indium Zinc Oxide), fluorine (F)-doped indium oxide ($In_2O_3$), tin oxide ($SnO_2$), antimony (Sb)-doped tin oxide ($SnO_2$), fluorine (F)-doped tin oxide ($SnO_2$), zinc oxide (ZnO), or the like. The transparent electrode 22 may include a transparent electrically-conductive material including gallium oxide, titanium oxide, niobium oxide, nickel oxide or the like as a base layer.

In the semiconductor laser 1A according to the present modification example, as with the foregoing semiconductor laser 1, the side surfaces 15S of the current confinement layer 15 at the peripheral edges of the opening 15A are also inclined. It is therefore possible to suppress the occurrence of a discontinuity at a step in the semiconductor layer (the third semiconductor layer 16) to be formed on the current confinement layer 15. Accordingly, it is possible to suppress a rise in the threshold current value resulting from the current confinement structure.

Further, because the transparent electrode 22 is provided between the third semiconductor layer 16 and the second electrode 19, it is possible to reduce the contact resistance between the third semiconductor layer 16 and the second electrode 19.

Modification Example 2

FIG. 6 schematically illustrates a cross-sectional configuration of a main part of a semiconductor laser (a semiconductor laser 1B) according to Modification Example 2 of the foregoing embodiment. The semiconductor laser 1B includes a third electrode (a third electrode 23) in contact with the current confinement layer 15. Except for this point, the semiconductor laser 1B has a configuration similar to that of the semiconductor laser 1, and workings and effects thereof are also similar.

The third electrode 23 is opposed to the active layer 13 with the current confinement layer 15 therebetween, and is disposed at a position farther from the opening 15A than the second electrode 19 in plan view, for example. The third electrode 23 is intended to apply a voltage to the current confinement layer 15. A metal film similar to the metal film of the first electrode 18 described above is usable for the third electrode 23. The third electrode 23 is formed on the surface of the current confinement layer 15 exposed by etching a portion of the third semiconductor layer 16, for example.

In the semiconductor laser 1B, as with the foregoing semiconductor laser 1, light emission occurs in the active layer 13 by applying a predetermined voltage (a forward voltage $V_F$) between the first electrode 18 and the second electrode 19. In addition, by applying a reverse voltage $V_R$ between the second electrode 19 and the third electrode 23, a depletion layer is formed in the vicinity of the current confinement layer 15. The size of the depletion layer is adjustable by the magnitude of the voltage $V_R$. Therefore, by providing the third electrode 23, it is possible to control the substantial size of the opening 15A of the current confinement layer 15.

In the semiconductor laser 1B according to the present modification example, as with the foregoing semiconductor laser 1, the side surfaces 15S of the current confinement layer 15 at the peripheral edges of the opening 15A are also inclined. It is therefore possible to suppress the occurrence of a discontinuity at a step in the semiconductor layer (the third semiconductor layer 16) to be formed on the current confinement layer 15. Accordingly, it is possible to suppress a rise in the threshold current value resulting from the current confinement structure.

Further, because the third electrode 23 for applying a voltage to the current confinement layer 15 is provided, it is possible to control the size of the depletion layer in the vicinity of the current confinement layer 15 and to thereby control the substantial size of the opening 15A.

FIG. 6 illustrates the semiconductor laser 1B that includes, together with the third electrode 23, the transparent electrode 22 between the third semiconductor layer 16 and the second electrode 19; however, the semiconductor laser 1B may include only the third electrode 23 out of the third electrode 23 and the transparent electrode 22.

Modification Example 3

FIG. 7 schematically illustrates a cross-sectional configuration of a main part of a semiconductor laser (a semiconductor laser 1C) according to Modification Example 3 of the foregoing embodiment. The semiconductor laser 1C includes a first light-reflecting layer (a first light-reflecting layer 24) between the substrate 11 and the first semiconductor layer 12. Except for this point, the semiconductor laser 2 has a configuration similar to that of the semiconductor laser 1, and workings and effects thereof are also similar.

The first light-reflecting layer 24 provided between the substrate 11 and the first semiconductor layer 12 includes a multilayered semiconductor film formed by an epitaxial growth method, for example. Specifically, a stacked structure of AlInN/GaN or the like is usable for the first light-reflecting layer 24. The first light-reflecting layer 24 does not have a curved surface (for example, the curved surface 17C in FIG. 1), and is configured by a flat surface.

In the semiconductor laser 1C according to the present modification example, as with the foregoing semiconductor laser 1, the side surfaces 15S of the current confinement layer 15 at the peripheral edges of the opening 15A are also inclined. It is therefore possible to suppress the occurrence of a discontinuity at a step in the semiconductor layer (the third semiconductor layer 16) to be formed on the current confinement layer 15. Accordingly, it is possible to suppress a rise in the threshold current value resulting from the current confinement structure.

Modification Example 4

FIG. 8 schematically illustrates a cross-sectional configuration of a main part of a semiconductor laser (a semiconductor laser 1D) according to Modification Example 4 of the foregoing embodiment. The semiconductor laser 1D includes a substrate (a substrate 25) different from the substrate (the substrate 11 in FIG. 1) used to grow the first semiconductor layer 12, etc. Except for this point, the semiconductor laser 1D has a configuration similar to that of the semiconductor laser 1, and workings and effects thereof are also similar.

The substrate 25 is a silicon (Si) substrate, for example. A first light-reflecting layer (a first light-reflecting layer 26), for example, is provided between the substrate 25 and the first semiconductor layer 12. More specifically, the first light-reflecting layer 26 is formed after polishing the substrate (for example, the substrate 11 in FIG. 2A) on which the first semiconductor layer 12, etc. have been epitaxially grown. The first light-reflecting layer 26 includes, for example, a multilayered dielectric film similar to that described above for the foregoing first light-reflecting layer 17A. The first light-reflecting layer 26 does not have a curved surface (for example, the curved surface 17C in FIG. 1), and is configured by a flat surface.

In the semiconductor laser 1D according to the present modification example, as with the foregoing semiconductor laser 1, the side surfaces 15S of the current confinement layer 15 at the peripheral edges of the opening 15A are also inclined. It is therefore possible to suppress the occurrence of a discontinuity at a step in the semiconductor layer (the third semiconductor layer 16) to be formed on the current confinement layer 15. Accordingly, it is possible to suppress a rise in the threshold current value resulting from the current confinement structure.

Although the present technology has been described above with reference to the embodiment and the modification examples, the present technology is not limited to the foregoing embodiment, etc., and may be modified in a variety of ways. For example, the components, arrangements, numbers, etc. in the semiconductor lasers 1, 1A, 1B, 1C, and 1D described as examples in the foregoing embodiment, etc. are merely exemplary. Not all of the components have to be provided, or any other component may further be provided.

Further, in the foregoing embodiment, etc., the case has been described where the opening 15A has a hexagonal shape in plan view; however, the opening 15A may have any shape in plan view such as a circular shape, an elliptic shape, a triangular shape, a quadrangular shape, or a polygonal shape having seven sides or more, for example.

Further, in the foregoing embodiment, etc., the case has been described where the side surfaces 15S of the current confinement layer 15 are the {1-101} planes; however, the side surfaces 15S may be any planes, and may be configured by crystal planes other than the {1-101} planes, for example.

It is to be noted that the effects described in this specification are merely exemplary and non-limiting, and other effects may be achieved.

It is to be noted that the present technology may also be configured as follows.

(1)

A surface-emitting semiconductor laser including:

an active layer including a nitride semiconductor;

a first semiconductor layer of a first electrical conduction type and a second semiconductor layer of a second electrical conduction type that are opposed to each other with the active layer therebetween; and a current confinement layer that is opposed to the active layer with the second semiconductor layer therebetween and has an opening, in which a side surface of the current confinement layer is inclined at at least a portion of a peripheral edge of the opening.

(2)

The surface-emitting semiconductor laser according to (1), in which the opening has a hexagonal shape in plan view.

(3)

The surface-emitting semiconductor laser according to (2), in which at least one side of the hexagonal shape is parallel to <11-20>.

(4)

The surface-emitting semiconductor laser according to any one of (1) to (3), in which the side surface is a {1-101} plane.

(5)

The surface-emitting semiconductor laser according to any one of (1) to (4), in which the current confinement layer contains $Al_zGa_{(1-z)}N$ (where $0 \leq z \leq 0.3$) or AlGaInN.

(6)

The surface-emitting semiconductor laser according to any one of (1) to (5), further including:

a first light-reflecting layer opposed to the active layer with the first semiconductor layer therebetween; and a second light-reflecting layer opposed to the active layer with the current confinement layer therebetween.

(7)

The surface-emitting semiconductor laser according to (6), in which the first light-reflecting layer is provided with a curved surface.

(8)

The surface-emitting semiconductor laser according to (6) or (7), further including a third semiconductor layer of the second electrical conduction type between the current confinement layer and the second light-reflecting layer.

(9)

The surface-emitting semiconductor laser according to (8), in which the third semiconductor layer has a superlattice structure of $Al_xIn_yGa_{(1-x-y)}N/Al_{x'}In_{y'}Ga_{(1-x'-y')}N$ (where $x \neq x'$, $y \neq y'$).

(10)

The surface-emitting semiconductor laser according to (8) or (9), further including:

a first electrode in contact with the first semiconductor layer; and a second electrode opposed to the current confinement layer with the third semiconductor layer therebetween.

(11)

The surface-emitting semiconductor laser according to (10), further including a transparent electrode provided between the second electrode and the third semiconductor layer.

(12)

The surface-emitting semiconductor laser according to any one of (8) to (11), in which the side surface of the current confinement layer is inclined in a direction in which the opening widens as approaching the third semiconductor layer from the second semiconductor layer.

(13)

The surface-emitting semiconductor laser according to any one of (1) to (12), further including a third electrode that is opposed to the active layer with the current confinement layer therebetween and is in contact with the current confinement layer.

(14)

The surface-emitting semiconductor laser according to any one of (1) to (13), in which the first electrical conduction type is an n-type, and the second electrical conduction type is a p-type.

(15)

The surface-emitting semiconductor laser according to any one of (1) to (14), in which the current confinement layer includes an n-type semiconductor or an intrinsic semiconductor.

(16)

The surface-emitting semiconductor laser according to any one of (1) to (15), in which the side surface of the current confinement layer is inclined at all of the peripheral edge of the opening.

This application claims priority from Japanese Patent Application No. 2018-143044 filed on Jul. 31, 2018 with the Japan Patent Office, the entire contents of which are incorporated in the present application by reference.

It should be understood by those skilled in the art that various modifications, combinations, sub-combinations and alternations may occur depending on design requirements and other factors insofar as they are within the scope of the appended claims or the equivalents thereof.

The invention claimed is:

1. A surface-emitting semiconductor laser comprising:
   an active layer including a nitride semiconductor;
   a first semiconductor layer of a first electrical conduction type and a second semiconductor layer of a second electrical conduction type that are opposed to each other with the active layer therebetween;
   a current confinement layer that is opposed to the active layer with the second semiconductor layer therebetween and has an opening, wherein a side surface of the current confinement layer is inclined at least a portion of a peripheral edge of the opening;
   a first light-reflecting layer opposed to the active layer with the first semiconductor layer therebetween;
   a second light-reflecting layer opposed to the active layer with the current confinement layer therebetween; and
   a third semiconductor layer of the second electrical conduction type between the current confinement layer and the second light-reflecting layer, wherein the third semiconductor layer has a superlattice structure of $Al_xIn_yGa_{(1-x-y)}N/Al_{x'}In_{y'}Ga_{(1-x'-y')}N$ where $x \neq x'$ and $y \neq y'$.

2. The surface-emitting semiconductor laser according to claim 1, wherein the opening has a hexagonal shape in plan view.

3. The surface-emitting semiconductor laser according to claim 2, wherein at least one side of the hexagonal shape is parallel to <11-20>.

4. The surface-emitting semiconductor laser according to claim 1, wherein the side surface is a {1-101} plane.

5. The surface-emitting semiconductor laser according to claim 1, wherein the current confinement layer contains $Al_zGa_{(1-z)}N$ (where $0 \leq z \leq 0.3$) or AlGaInN.

6. The surface-emitting semiconductor laser according to claim 1, wherein the first light-reflecting layer is provided with a curved surface.

7. The surface-emitting semiconductor laser according to claim 1, further comprising:
   a first electrode in contact with the first semiconductor layer; and
   a second electrode opposed to the current confinement layer with the third semiconductor layer therebetween.

8. The surface-emitting semiconductor laser according to claim 7, further comprising a transparent electrode provided between the second electrode and the third semiconductor layer.

9. The surface-emitting semiconductor laser according to claim 1, wherein the side surface of the current confinement layer is inclined in a direction in which the opening widens as approaching the third semiconductor layer from the second semiconductor layer.

10. The surface-emitting semiconductor laser according to claim 7, further comprising a third electrode that is opposed to the active layer with the current confinement layer therebetween and is in contact with the current confinement layer.

11. The surface-emitting semiconductor laser according to claim 1, wherein the first electrical conduction type is an n-type, and the second electrical conduction type is a p-type.

12. The surface-emitting semiconductor laser according to claim 1, wherein the current confinement layer includes an n-type semiconductor or an intrinsic semiconductor.

13. The surface-emitting semiconductor laser according to claim 1, wherein the side surface of the current confinement layer is inclined at all of the peripheral edge of the opening.

14. The surface-emitting semiconductor laser according to claim 1, wherein a third semiconductor layer portion of the third semiconductor layer includes the superlattice structure.

15. The surface-emitting semiconductor laser according to claim 14, wherein the third semiconductor layer portion has a concentration of a p-type impurity higher than another portion of the third semiconductor layer, thereby functioning as a contact layer.

* * * * *